(12) United States Patent
Clark et al.

(10) Patent No.: US 8,207,735 B2
(45) Date of Patent: Jun. 26, 2012

(54) METHOD AND APPARATUS FOR TUNING AND MATCHING MRI/NMR PROBE

(75) Inventors: Melvin Daniel Clark, Gainesville, FL (US); John Robert Forder, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 399 days.

(21) Appl. No.: 12/522,731

(22) PCT Filed: Jan. 10, 2008

(86) PCT No.: PCT/US2008/000363
§ 371 (c)(1),
(2), (4) Date: Jul. 10, 2009

(87) PCT Pub. No.: WO2008/086031
PCT Pub. Date: Jul. 17, 2008

(65) Prior Publication Data
US 2010/0066370 A1    Mar. 18, 2010

Related U.S. Application Data

(60) Provisional application No. 60/879,829, filed on Jan. 10, 2007.

(51) Int. Cl.
*G01V 3/00*    (2006.01)
(52) U.S. Cl. .......................... 324/322; 324/318
(58) Field of Classification Search .................. 324/322, 324/318, 309, 307, 306, 300
See application file for complete search history.

(56) References Cited

U.S. PATENT DOCUMENTS

| | | | |
|---|---|---|---|
| 4,446,431 A | 5/1984 | McKay | |
| 4,827,219 A * | 5/1989 | Harrison | 324/322 |
| 5,670,881 A * | 9/1997 | Arakawa et al. | 324/322 |
| 5,828,216 A | 10/1998 | Tschudin et al. | |
| 6,107,798 A * | 8/2000 | Hoult | 324/318 |
| 6,408,202 B1* | 6/2002 | Lima et al. | 600/423 |
| 2005/0062472 A1 | 3/2005 | Bottomley | |

OTHER PUBLICATIONS

Fukushima, E. et al., "Experimental Pulse NMR, A Nuts and Bolts Approach," 1981, Reading, Addison-Wesley, MA.
Hoult, D.I., et al., "The signal to noise ratio of nuclear magnetic resonance experiment," *Journal of Magnetic Resonance*, 1976, pp. 71-85, vol. 24.
King, R.W.P., of al., "Transmission Lines, Antennas, and Wave Guides," 1945, McGraw-Hill, New York.
Terman, F.E., "Radio Engineer's Handbook," 1943, McGraw-Hill, New York.
Villa, P., et al., "Probe efficiency improvement with remote and transmission line tuning and matching," *Magnetic Resonance Imaging*, 1999, pp. 1083-1086, vol. 17, No. 7.

* cited by examiner

*Primary Examiner* — Louis Arana
(74) *Attorney, Agent, or Firm* — Saliwanchik, Lloyd & Eisenschenk (57) ABSTRACT

A method and apparatus for tuning the frequency and matching the impedance of an RF coil, or probe, used for nuclear magnetic resonance (NMR)/magnetic resonance imaging (MRI) are provided. In NMR/MRI, the RF coils used to acquire the data are tuned and impedance matched for enhanced performance. An embodiment of the subject invention allows for enhanced frequency and impedance adjustments to be made remotely when, for example, space for accessing the mechanical matching components is limited or not available. Applications in which embodiments of the invention can be beneficial include, but are not limited to, medical systems, very high field research magnets and research or commercial MRI/NMR systems.

63 Claims, 10 Drawing Sheets

METHOD AND APPARATUS FOR TUNING AND MATCHING MRI/NMR PROBE

CROSS-REFERENCE TO RELATED APPLICATIONS

The present application is the U.S. National Stage Application of International Patent Application No. PCT/US2008/000363, filed on Jan. 10, 2008, which claims the benefit of U.S. Provisional Patent Application Ser. No. 60/879,829, filed Jan. 10, 2007, both of which are hereby incorporated by reference herein in their entirety, including any figures, tables, or drawings.

BACKGROUND OF INVENTION

In nuclear magnetic resonance (NMR) and magnetic resonance imaging (MRI), the RF coil, or probe, used to acquire data is typically tuned to adjust the frequency of the coil and impedance matched to match the impedance of the coil to the system, for optimum performance. The problems associated with tuning and matching NMR/MRI radio frequency (RF) coils have been addressed in many different ways. The usual method is to place a lumped circuit of tuning and matching capacitors in close proximity to the RF coil.

Variable capacitors are preferred in order to adjust the tuning/matching with varying loads, but are physically much larger than fixed capacitors and, thus, sometimes difficult to locate in close proximity to the coil. In some cases it becomes time consuming and difficult to tune and match the coil properly with varying loads and coupling once it is inside the magnet, as the coil is difficult to reach. The common solution to this problem has been to employ mechanical extension arms to reach inside the magnet, mechanically couple to the variable capacitor's adjustment knob, and adjust the variable capacitors from a distance, in order to tune and match the coil. Such mechanical extension arms are time-consuming to use, and are difficult to couple to, and adjust, the variable capacitors. Further, lack of feedback from the mechanical extension arms makes it difficult to accurately determine the position of the variable capacitor's adjustment knob which can lead to broken capacitors.

Another solution is to place the matching circuit outside the magnet at the common point, usually the transmit/receive module. Matching is then realized from this point to the coil. Power transfer to the RF coil from the RF transmitter and the signal detected by the coil and received at the preamp relies on the characteristic impedance of the transmission line. Accordingly, many previous approaches to remote tuning have suffered from instability due to stray capacitances.

BRIEF SUMMARY

Embodiments of the invention pertain to a method and apparatus for tuning the frequency and matching the impedance of an RF coil, or probe. In specific embodiments, the RF coil can be used for NMR/MRI. In NMR/MRI, the RF coils used to acquire the data are tuned and impedance matched for enhanced performance. An embodiment of the subject invention allows for enhanced frequency and impedance adjustments to be made remotely when, for example, space for accessing the mechanical matching components is limited or not available. Applications in which embodiments of the invention can be beneficial include, but are not limited to, medical systems, very high field research magnets and research or commercial MRI/NMR systems.

An embodiment of the invention can decrease the set-up time required for patient studies in hospitals as well as research experiment set-up time in laboratories. An embodiment of the invention may also provide higher quality data from each experiment and/or study, reducing the acquisition time needed and allowing more patient studies per day for hospitals and laboratories.

An embodiment of the subject invention uses a matching and tuning circuit that reduces or eliminates stray capacitances. In an embodiment, a combination of NMR coil reactance and cable impedance, all referenced to ground to create a purely resistive match and eliminate stray capacitances can be utilized. The subject circuit can be referred to as a matching tuning (M-T) box circuit. The subject M-T box circuit can be especially effective at high fields with varying sample loads and in applications where space considerations are paramount.

DETAILED DISCLOSURE

Embodiments of the invention pertain to a method and apparatus for tuning the frequency and matching the impedance of an RF coil, or probe. In specific embodiments, the RF coil can be used for NMR/MRI. In NMR/MRI, the RF coils used to acquire the data are tuned and impedance matched for enhanced performance. An embodiment of the subject invention allows for enhanced frequency and impedance adjustments to be made remotely when, for example, space for accessing the mechanical matching components is limited or not available. Applications in which embodiments of the invention can be beneficial include, but are not limited to, medical systems, very high field research magnets and research or commercial MRI/NMR systems.

An embodiment of the invention can decrease the set-up time required for patient studies in hospitals as well as research experiment set-up time in laboratories. An embodiment of the invention may also provide higher quality data from each experiment and/or study, reducing the acquisition time needed and allowing more patient studies per day for hospitals and laboratories.

An embodiment of the subject invention uses a matching and tuning circuit that reduces or eliminates stray capacitances. In an embodiment, a combination of NMR coil reactance and cable impedance, all referenced to ground to create a purely resistive match and eliminate stray capacitances can be utilized. The subject circuit can be referred to as a matching tuning (M-T) box circuit. The subject M-T box circuit can be especially effective at high fields with varying sample loads and in applications where space considerations are paramount.

Various embodiments of the invention can be utilized in any application with an RF coil (i.e., all RF coil variants), including, but not limited to, volume coils, surface coils, local variants (implanted and insertable), microcoils, and variations that are receive only, transmit only, and transcieve (transmit and receive).

Examples of coil variants that can utilize embodiments of the invention include phased array coils (and array coil variants), decoupling coils, transverse electromagnetic (TEM) coils, Quadrature coils, cavity coils and their variants, and all variants of the above that involve two or more frequencies (multituned coils), whether on one coil structure or multiple coils. Embodiments of the invention can be used with systems, including, but not limited to, NMR, MRI and variants, solids NMR/MRI, gas NMR/MRI, hyperpolarised NMR/MRI, electron spin resonance (ESR) (and ESR imaging), which is also known as electron paramagnetic resonance (EPR), (at RF frequencies) and ion cyclotron resonance (ICR), with all variants as described for all NMR as above.

Figure 1:
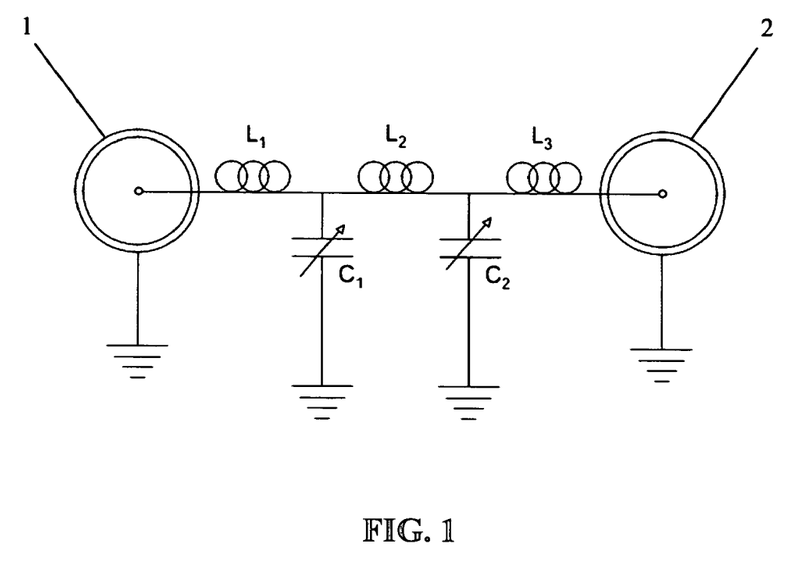
FIG. 1 shows an M-T box circuit in accordance with an embodiment of the subject invention.
Figure 2:
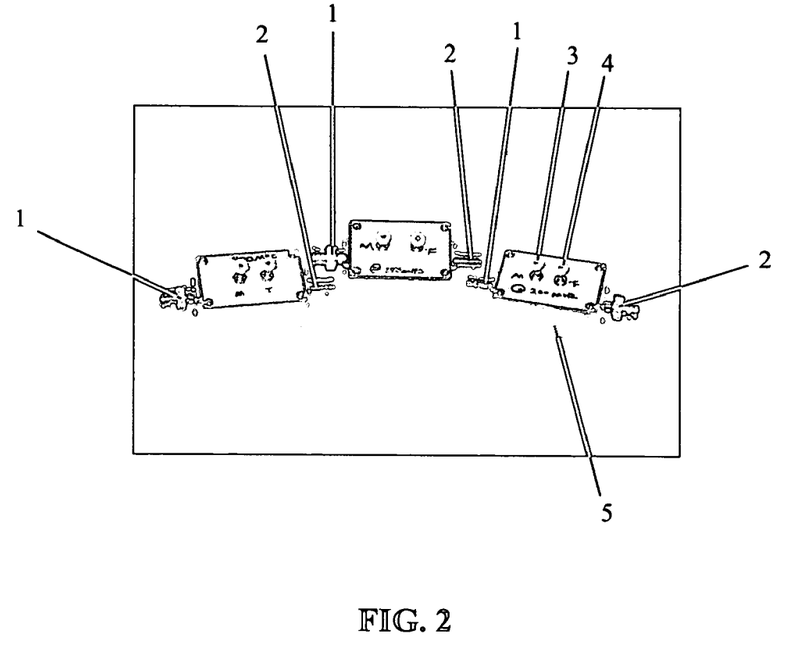
FIG. 2 shows a set of box circuits in accordance with an embodiment of the subject invention incorporating two variable capacitors.

FIG. 1 shows a specific box circuit that can be utilized for remote tuning and matching of an RF coil. The circuit utilizes three inductors $L_1$, $L_2$, and $L_3$, and two variable capacitors $C_1$ and $C_2$, with two connectors (1 and 2) shown, one on the left and another on the right. In FIG. 2, three devices are shown incorporating the electronic circuit of FIG. 1. One connector can be used to interconnect with, for example, a switch that controls connection to a transmitter and receiver. The second connector can be used to connect to the NMR probe and RF coil that is being matched and tuned. In a specific embodiment, the connectors can be male and/or female BNC (Bayonet Neill Concelman) coaxial cable connectors. Specific embodiments can connect the RF coil and the box circuit via a transmission line, such as twin leads or coaxial cable. Specific embodiments can utilize coaxial cables as a connector, which can travel to the RF coil through, for example, a fiberglass tube. In addition, two adjustment knobs (3 and 4) can be provided for the two variable capacitors ($C_1$ and $C_2$), one for tuning the frequency of the coil and one for matching the impedance of the coil to the system. The inductors and variable capacitors can be housed within a shielded box 5. The shielded boxes 5 can be obtained through commercial sources. In an embodiment, the shielded boxes can be made non-magnetic.

In FIG. 1, there is a common ground shown for the circuit elements, which can reduce, or eliminate, stray capacitance due to, for example, objects being in the vicinity of the circuit. The common ground can be connected to a shield 5, such as a metal chassis. Such grounding can be accomplished by connection to the outside of the circuit housing. In other embodiments, common grounding is not utilized. For such embodiments, the device can be shielded or use other techniques for reducing or preventing stray capacitance.

The circuit shown in FIG. 1 can be considered two L-circuits interconnected with the center inductor, $L_2$, which forms a T-circuit. In alternative embodiments, one or more of the inductors can be replaced with capacitors and/or the capacitors and the inductors can be interchanged. In a specific embodiment, three variable capacitors can replace the three inductors in the embodiment of FIG. 1 and two inductors can replace the variable capacitors shown in FIG. 1. Further embodiments can include $L_1$ and $C_1$, $L_1$, $L_2$, and $C_1$, $L_1$, $L_2$, $C_1$ and $C_2$, or can add a $L_4$ and/or $C_3$, or more. The design of the circuit can be accomplished depending on the parameters of the coil, system, and sample. Preferably, the circuit has an adjustment that allows the addition and/or subtraction of a phase angle, for tuning the frequency of the coil, and an adjustment for adding and/or removing reactance, for matching the impedance of the coil to the system.

Figure 3:
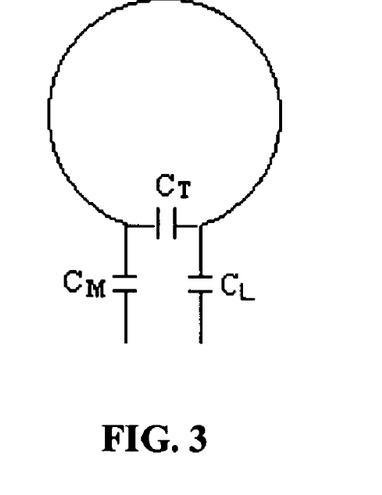
FIG. 3 shows a typical NMR RF coil circuit.

Referring to FIG. 3, typical RF NMR coil has a tuning capacitor ($C_T$), which has a variable or fixed value, in series with the coil windings and two capacitors (impedance matching capacitor $C_M$ and load adjusting capacitor $C_L$), one connected to each lead of the capacitor in series with the coil windings ($C_T$) and each of the leads of the two capacitors connected to a coaxial cable (one capacitor connected to the center conductor $C_M$ and one capacitor connected to the outer conductor $C_L$). An embodiment of the invention incorporates a coil with three such capacitors connected to a box circuit. Another embodiment incorporates a coil with the tuning capacitor ($C_T$) connected to a box circuit. The three capacitors at the coil can each be variable or fixed value and the coaxial cable can run all the way out to the box circuit or can terminate at, for example, a BNC connector or other appropriate connector. The use of fixed value capacitors at the coil can save cost and space proximate the coil. The box circuit can then add additional tuning and matching adjustment ranges or can provide the entire adjustment range for the coil system. Alternative embodiments can use other permutations of capacitors or other elements at the coil.

In an embodiment, the coaxial cable, or other transmission line, connecting the RF coil to the box circuit can have length in the range of about one inch to above 20 feet. Other embodiments can be longer. In another specific embodiment, the coaxial cable can be between 1 foot and 6 feet and in a further specific embodiment between 3 feet and 9 feet. The length of coaxial cable is primarily based on the distance from where a user can conveniently adjust the circuit elements, such as variable capacitor, and where the coil needs to be positioned during measurements. Embodiments can also incorporate two or more box circuits at various locations on the length of the coaxial cable. Each of the boxes can tune a different coil in, for example, quadrature systems, phased array systems, or systems for multiple frequencies. The length of the coaxial cable can also be selected to provide a certain impedance value.

The box circuits in accordance with the subject invention can be designed for operation in certain frequency ranges, such as less than or equal to 100 MHz, greater than 100 MHz, greater than 150 MHz, or greater than 300 MHz. The design depends on the parameters of the coil, system, and samples and can be such that the Q of the coil, is, for example, less than or equal to 100, greater than 100, greater than 150, or greater than 300.

Advantageously, a device incorporating a box circuit in accordance with the subject invention can have two connectors and be inserted in the system circuitry, for example, between the coil and a receiver, transmitter, transceiver, or switch. The device can be made of non-magnetic materials if, for example, it is desired to use near the MRI/NMR magnet. The device can incorporate magnetic materials if, for example, the device is going to be positioned away from the NMR/MRI magnet or shielded from magnetic fields from such magnets.

Embodiments of the invention can involve tuning and matching while viewing a tuning and matching instrument supplied by the manufacture of a spectrometer, such that visual cues can enhance the accuracy of the tuning and matching.

Example 1

Figure 4:
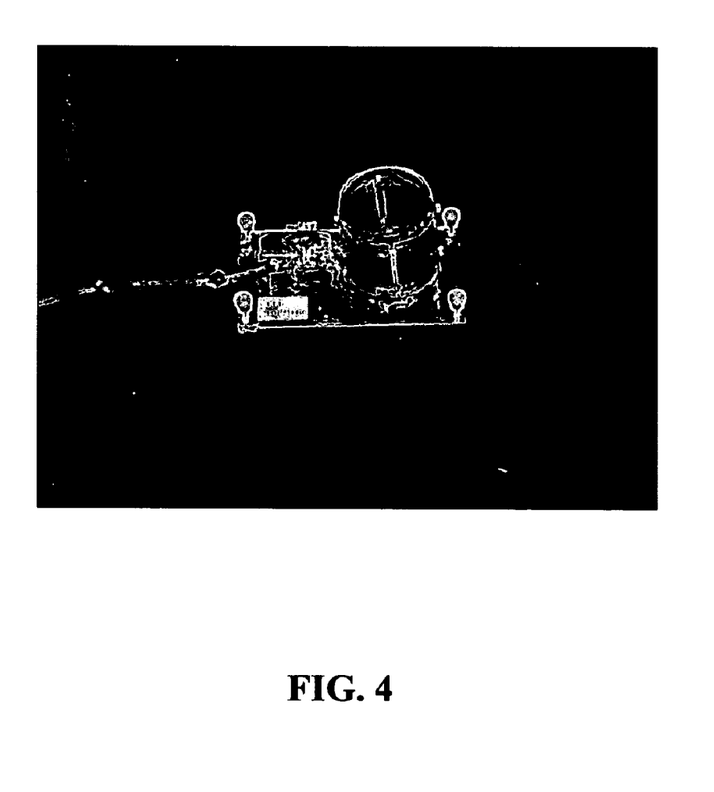
FIG. 4 shows a 470 MHz loop gap probe body used in Example 1.

For this example, a loop gap coil (32×35 mm), such as shown in FIG. 4, was loaded with copper sulfate solution. It should be noted that the method described here can work with any RF coil. The probe was tuned using a HP8753E Network Analyzer and the effect of coupling with the magnet simulated using a copper clad cylinder. The coil is said to be unmatched when the matching capacitor has been adjusted until it exhibits a reactance other than 50 ohms impedance at the end of the transmission line. This results in a low value, such as less than −4 db, of return loss (S11) tuning dip observed on the network analyzer. The properly matched and tuned circuit has approximately a −35 db return loss dip. The results were also compared with bench tests performed on the circuit using the HP 8753E Network Analyzer with port calibrations and the use of the Smith Chart functions. The M-T box circuit used in this example is shown in FIG. 1, and incorporates a symmetrical and balanced capacitance/inductance network where all components are effectively grounded. The adjustment shafts of the M-T boxes capacitors are connected to ground potential to reduce or remove the stray capacitance effect. The outside of the M-T box is at ground potential to reduce stray capacitance and also protect against RF burns or shock.

Example 1 experiments were performed using a Bruker Avance Spectrometer and an 11.1 T 40 cm bore Magnex magnet (proton resonant frequency of 470.74 MHz). The distance to the isocenter of this magnet is 130 cm. Imaging was performed using standard spin echo sequences, (256× 256 TR=300 ms, TE=7.7 ms, FOV=6 cm, slice thickness=1 mm). Signal to noise ratio (SNR) measurements were made from an image slice through the center of the phantom where the B1 RF homogeneity was optimal. The SNR was computed from the average of four mean values and four noise values taken from four different images for each case. The pulse transmission was optimized for maximized steady state signal so that no over-tipping occurred with the copper sulfate solution. The attenuation values provided by the spectrometer's software were recorded for all experiments to determine efficiency. Consequently, less attenuation means more radio frequency transmitter power. In a series of experiments, the SNR was measured under different matching and tuning conditions with or without the M-T box circuit in line.

When the standard NMR coil's matching and tuning circuit was set to 63 or 400 ohms total reactance, the M-T box circuit could perform an optimal circuit match. The changes in reactance were accomplished by increasing the capacitance value of the RF coils matching capacitor or reducing the capacitance value of the RF coils matching capacitor, and the values acquired were recorded from the calibrated Smith Chart on the Network Analyzer. In each test, the addition of the M-T box to the mismatched NMR coil improved the power transfer and the SNR. The SNR improved slightly over the tuned and matched RF coils value since the addition of the M-T box removed any losses from the circuit due to a slight mismatch or coupling when the coil is positioned inside the magnets bore. With the M-T box circuit in place, the M-T box circuit reduces, or eliminates, the difficult and time consuming task to properly tune and match a coil inside the magnet bore with mechanical adjustment rods reaching 130 cm from the RF coil. The best SNR is directly determined by the quality of the RF coil and not the circuit matching. Better matching will increase the signal transfer and thereby maximize the quality factor of the NMR coil.

Referring back to FIG. 1, a specific embodiment of an M-T box circuit in accordance with the subject invention is shown. Example 1 describes experiments performed with this box circuit. When using the M-T box circuit one may use an un-matched and fixed tuned NMR coil. The M-T box has been tested to give excellent results with coil impedances from 1 ohm to greater than 1000 ohms.

The M-T box circuit is efficient when external tuning/matching capability is required and has proven useful in multinuclear spectroscopy and in imaging on both horizontal and vertical magnet systems. This results in a substantial reduction in experiment set-up time in applications where access to the probes local tuning and matching circuit is difficult if not impossible. This arrangement will be particular useful when space is at a premium, for example in array and/or multinuclear coils at high fields where the magnet bore size is limited. As ever-higher fields are developed (in strength and expense), it is imperative that maximum utility of the available magnet bore is exploited.

TABLE 1

Comparison of NMR RF coil, matched, mismatched (to 63 and 400 ohms), and with the addition of the remote M-T box circuit.

| NMR RF Coil | ADC filling | Power attenuation | Receiver Gain | SNR |
|---|---|---|---|---|
| Matched & Tuned coil | 85% | −18 db | 400 | 65 |
| Mismatch = 63 ohms | 87% | −17 db | 400 | 59 |
| Plus M-T box | 87% | −18 db | 400 | 66 |
| Mismatch = 400 ohms | 60% | −9 db | 400 | 59 |
| Plus M-T box | 86% | −11 db | 400 | 73 |

Table 1 shows that the transmitter power attenuation and the SNR of a conventionally matched and tuned coil (top row) are recovered for the test where the coil is mismatched to 63 ohms reactance (row 2) and MT box has been added (row 3) or mismatched to 400 ohms (row 4) and then M-T box circuit was added (bottom row). In both cases, when the RF coil's matching capacitors impedance is increased above the standard 50 ohms, more power is needed to overcome the increase in series impedance. The extra power needed in the test was dissipated in the series matching capacitor that was adjusted to 400 ohms reactance for 470 MHz and not in the RF coil. The voltage had to be raised in order to get the same 0.28 amps to the coil for the required B1 field to produce good homogeneity results needed for SNR testing.

Example 2

The development of the 900 MHz UWB magnet at the National High Magnetic Field Laboratory (NHMFL) generates significant challenges in RF engineering. The construction of relatively large volume coils at such high frequencies provides challenges in terms of tuning and matching, loading, RF inhomogeneities and wave effects, and the tight spatial constraints in in vivo studies looking to maximize the full use of the magnet bore. The increased length of the magnet and hence the RF probe also provides non-trivial issues for remote tuning and matching, sample maintenance in in vivo studies, and SNR maximization.

Figure 5:
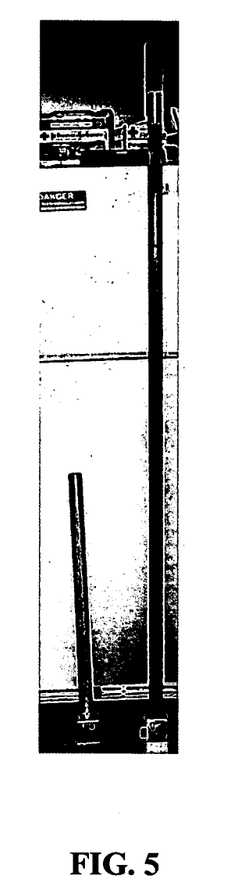
FIG. 5 shows a 900 MHz probe (on right) next to a 750 MHz probe (on left).

In this example, a single tuned birdcage coil at 900 MHz is described, incorporating an embodiment of the subject remote tuning device. These coils fit in the conventional wide bore gradients of the 900 MHz system. FIG. 5 shows a 900 MHz probe body (on right) next to a 750 MHz probe body (on left).

Figure 6:
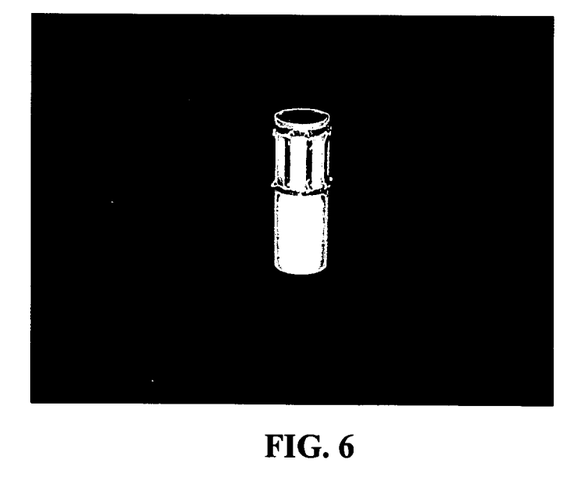
FIG. 6 shows a typical birdcage coil constructed for used in both the 750 MHz NMR probe body and the 900 MHz NMR probe body.
Figure 7:
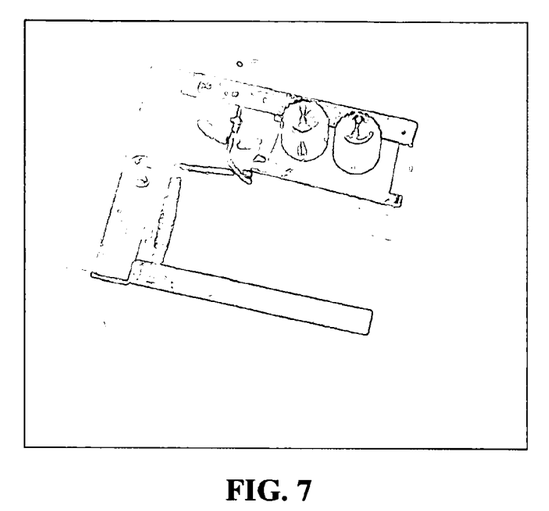
FIG. 7 shows a 900 MHz probe body with an M-T box according to an embodiment of the subject invention attached at the opposite end from an RF birdcage coil.

A conventional birdcage coil, as shown in FIG. 6, was constructed to fit on a wide bore probe body suitable for the 900 MHz system. The eight element array was a low pass design (capacitors in the element rungs). FIG. 7 shows the 900 MHz probe with an embodiment of the subject box circuit attached at the end opposite the coil. To facilitate remote tuning and matching an embodiment of the subject remote circuit was placed at the end of the probe body. This remote circuit provides easy tuning and matching with minimal signal loss. Coils were constructed at 750 MHz and 900 MHz for the two systems and the images and SNR improvements examined using conventional imaging sequences.

Figure 8:
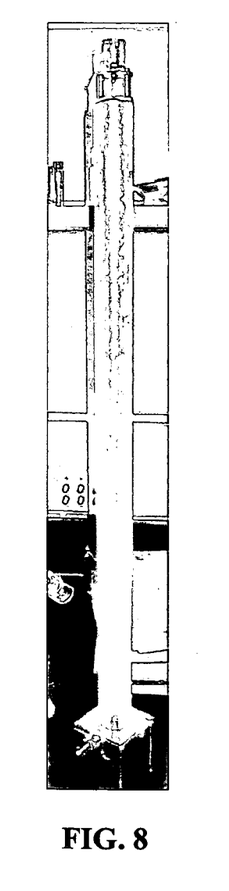
FIG. 8 shows a 750 MHz probe body constructed for use in MRI.
Figure 9A:
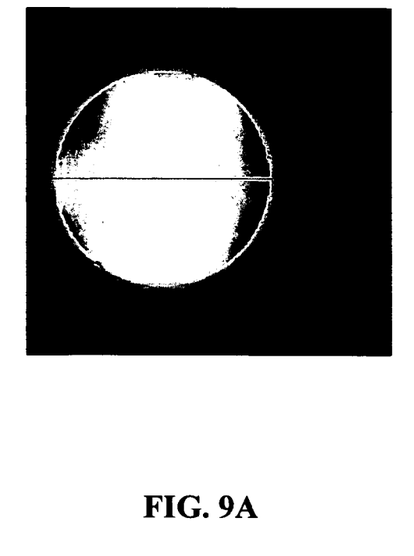
FIG. 9A shows an image acquired on a 15-mm diameter 0.9% saline phantom: that exhibit homogeneity of the images at 900 MHz or 21.1 Tesla.
Figure 9B:
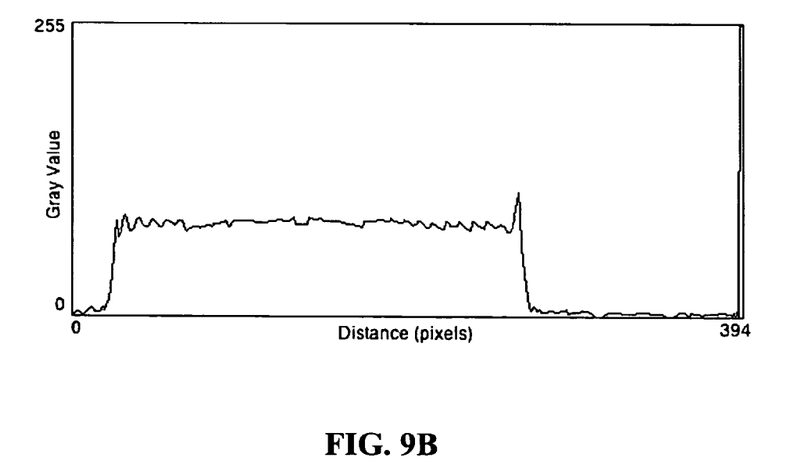
FIG. 9B is the plot profile of FIG. 9A that shows horizontal pixel intensity values of that image.
Figure 9C:
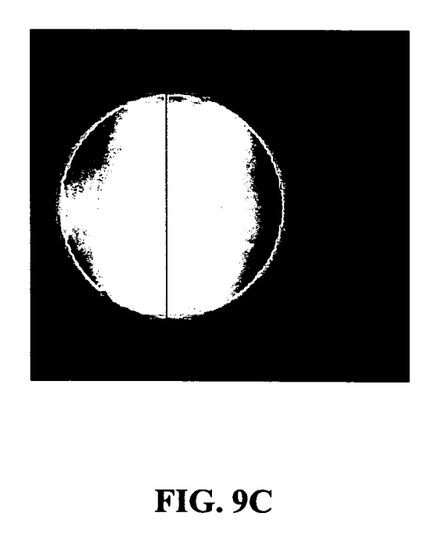
FIG. 9C shows an image acquired on 15-mm diameter 0.9% saline phantom: that exhibit homogeneity of the images at 900 MHz or 21.1 Tesla.
Figure 9D:
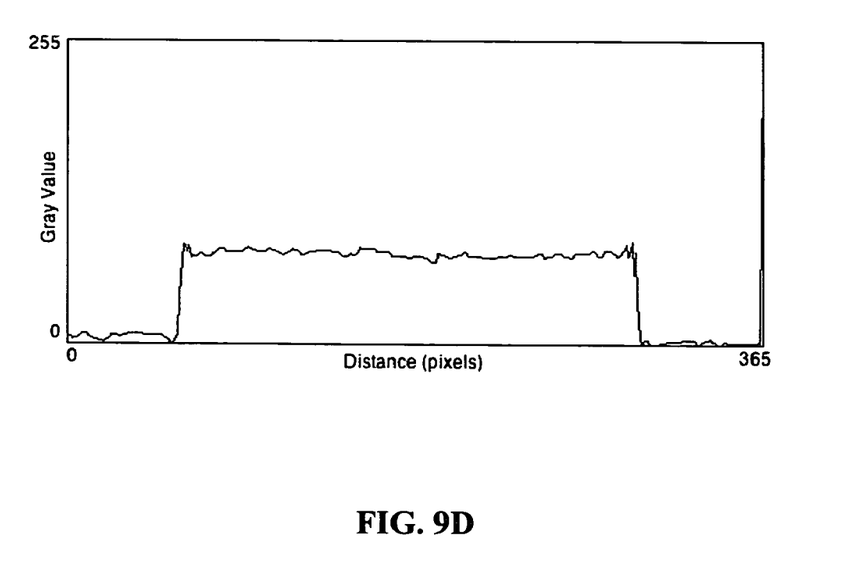
FIG. 9D is the plot profile of FIG. 9C that shows vertical pixel intensity values of that image.
Figure 9E:
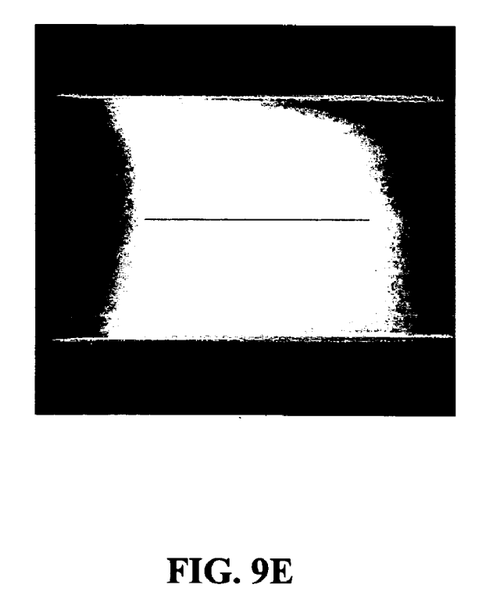
FIG. 9E shows an image acquired on 15-mm diameter 0.9% saline phantom: that exhibit homogeneity of the images at 900 MHz or 21.1 Tesla.
Figure 9F:
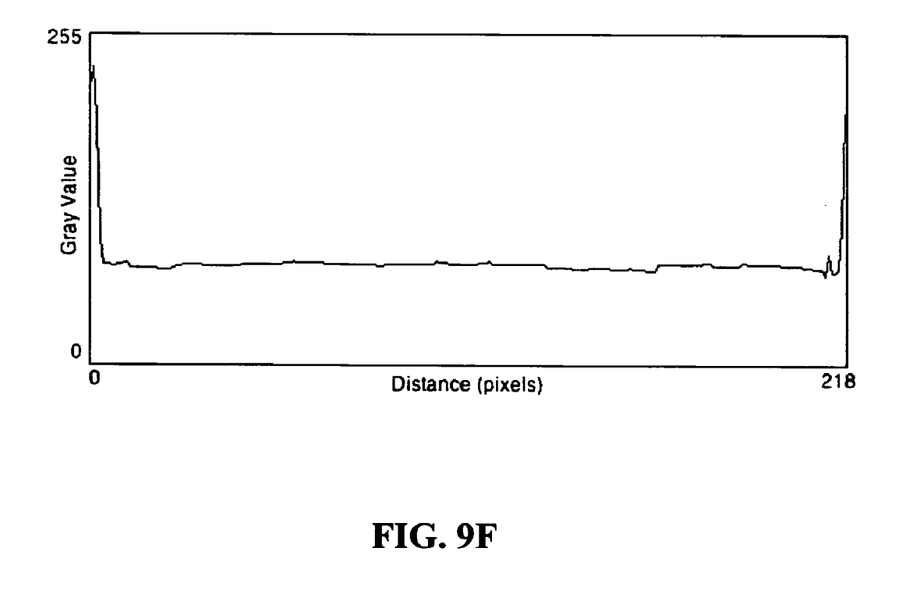
FIG. 9F is the plot profile of FIG. 9E that shows the central region of the image pixel intensity values.
Figure 10A:
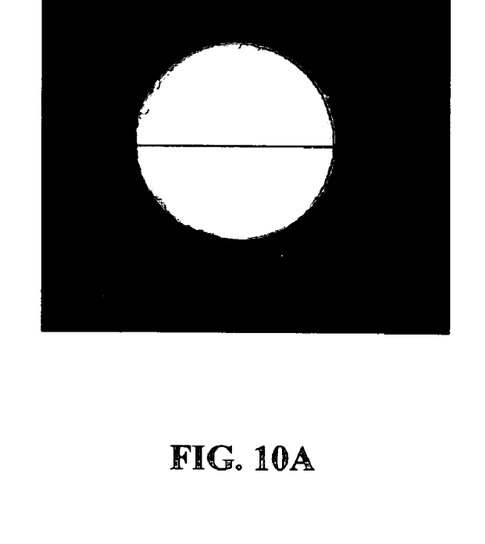
FIG. 10A shows an image acquired on 15-mm diameter 0.9% saline phantom that exhibit homogeneity of the images at 750 MHz or 17 Tesla.
Figure 10B:
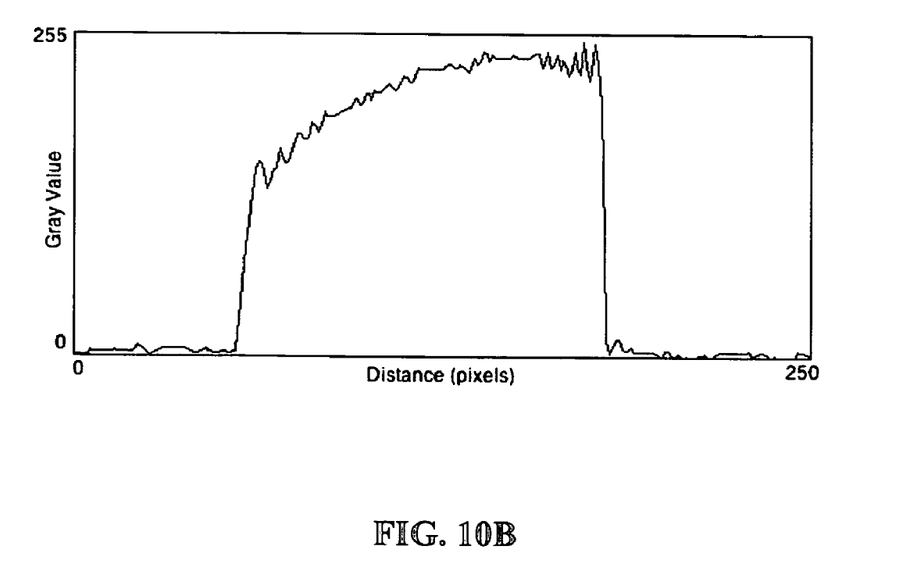
FIG. 10B is the plot profile of FIG. 10A that shows horizontal pixel intensity values of that image.
Figure 10C:
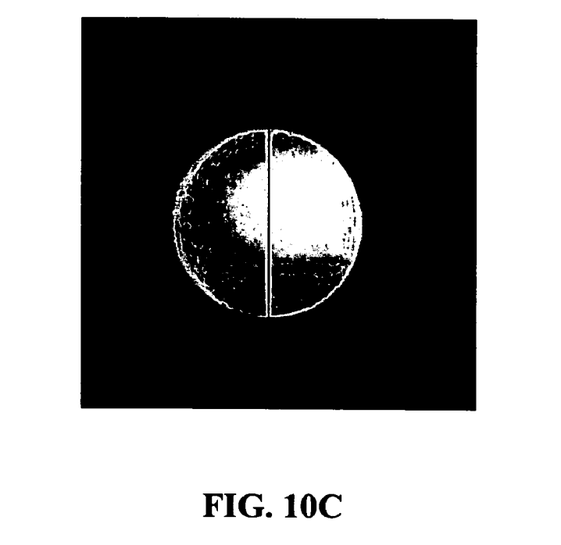
FIG. 10C shows an image acquired on 15-mm diameter 0.9% saline phantom that exhibit homogeneity of the images at 750 MHz or 17 Tesla.
Figure 10D:
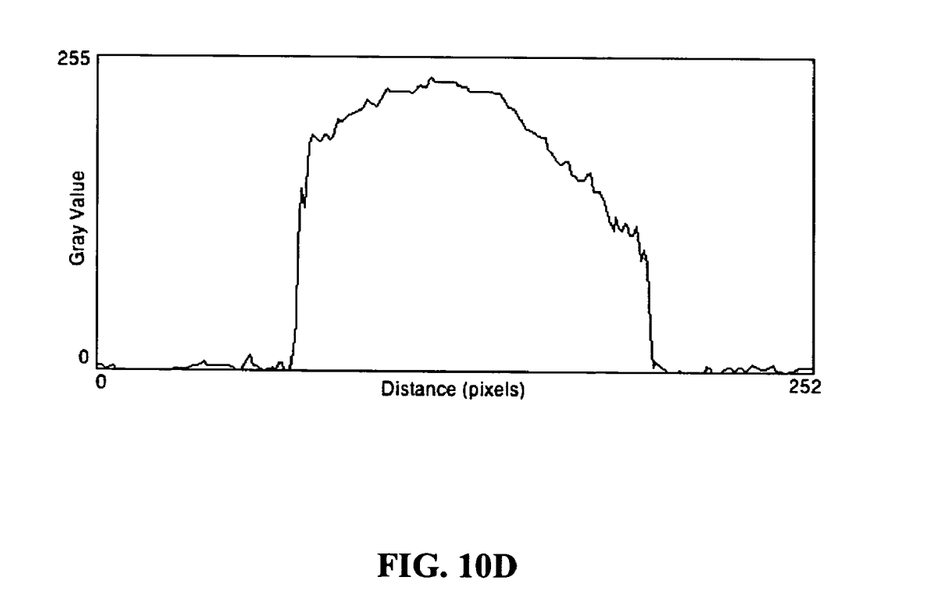
FIG. 10D is the plot profile of FIG. 10C that shows vertical pixel intensity values of that image.
Figure 11:
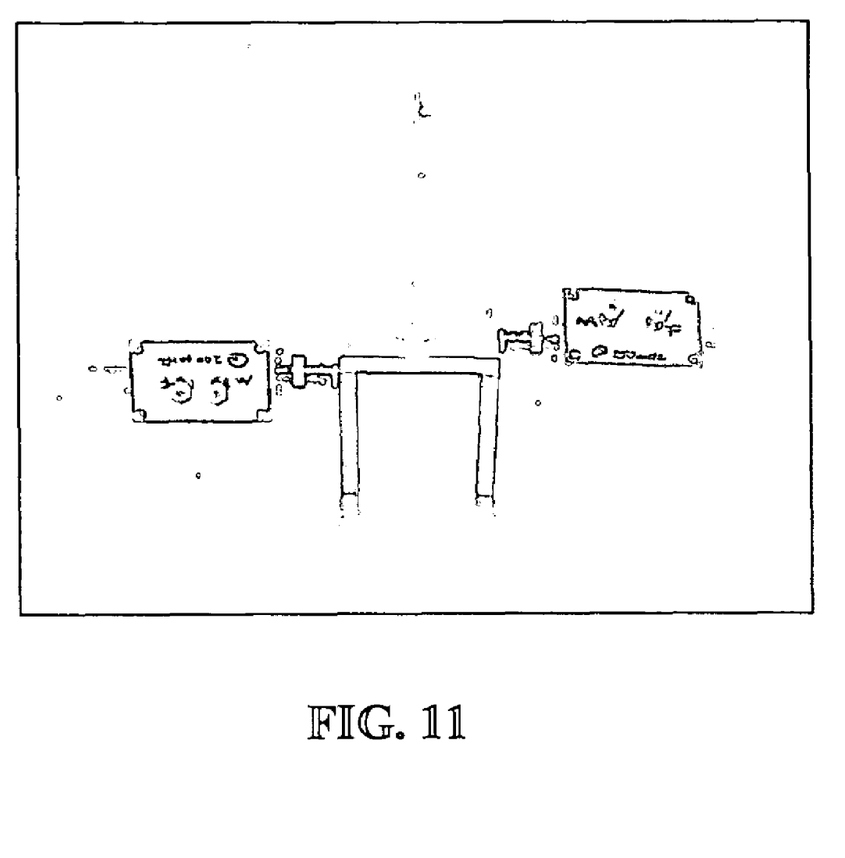
FIG. 11 shows an example of the use of the matching and tuning boxes for multiple frequencies in one probe body, which can be referred to as a multinuclear NMR probe.

2.5 cm×2.0 cm diameter RF coils were constructed for imaging a mouse brain in vivo. First, a probe was constructed at 750 MHz (see FIG. 8) and performed satisfactorily, i.e., gave similar performance characteristics to existing probes. Subsequently, a probe was constructed at 900 MHz on a probe body and designed to accommodate in vivo samples. The increased length of the probe is evident when compared with the 750 MHz narrow bore probe body as shown in FIG. 5. As shown in FIGS. 9A-9F, phantom images demonstrated excellent image homogeneity both axially and longitudinally. The SNR improvement from 750 MHz to 900 MHz was demonstrated as expected at approximately 40%. The image homogeneity and SNR improvements at this high field when compared to data at 750 MHz conformed to expectations. FIGS. 10A and 10B are axial image examples of SNR and homogeneity at 750 MHz. Similar multi-tuned RF coils, for example for $^{23}$Na and $^{13}$C applications, can also utilize embodiments of the subject box circuit. FIG. 11 shows a multinuclear NMR double tuned probe designed for the 750 MHz system in accordance with an embodiment of the subject invention. According to such an embodiment, an M-T box circuit can be provided for each frequency range to be used.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A method of tuning and matching a radio frequency (RF) coil, comprising:
    providing an RF coil;
    providing a box circuit;
    connecting the RF coil to the box circuit via a connecting cable; and
    tuning the frequency of the RF coil and matching the impedance of the RF coil via the box circuit, wherein tuning the frequency of the RF coil and matching the impedance of the RF coil via the box circuit comprises:
    adding and/or removing reactance via the box circuit; and/or
    introducing and/or removing a phase shift via the box circuit,
    wherein adding and/or removing reactance via the box circuit, and/or introducing and/or removing a phase shift via the box circuit, comprises adjusting a first reactance of a first variable reactive element and adjusting a second reactance of a second variable reactive element.

2. The method according to claim 1, wherein providing an RF coil comprises providing a nuclear magnetic resonance (NMR) RF coil.

3. The method according to claim 1, wherein providing an RF coil comprises providing a magnetic resonance imaging (MRI) RF coil.

4. The method according to claim 1,
    wherein the box circuit is located at least 1 foot from the RF coil.

5. The method according to claim 1,
    wherein the box circuit is located at least 3 feet from the RF coil.

6. The method according to claim 1,
    wherein the box circuit is between 1 foot and 3 feet from the RF coil.

7. The method according to claim 1,
    wherein the box circuit is between 3 feet and 9 feet from the RF coil.

8. The method according to claim 1, wherein the RF coil comprises:
    a tuning capacitor.

9. The method according to claim 8, wherein the RF coil further comprises:
    an impedance matching capacitor and a load adjusting capacitor, wherein the tuning capacitor, the impedance matching capacitor, and the load adjusting capacitor are fixed value capacitors.

10. The method according to claim 1, wherein the box circuit comprises:
    a first inductor, a second inductor, and a third inductor connected in series between a first connector and a second connector;
    the first variable reactive element, wherein the first variable reactive element is a first variable capacitor, wherein a first end of the first variable capacitor is connected to the first inductor and the second inductor and a second end of the first variable capacitor is connected to ground; and
    the second variable reactive element, wherein the second variable reactive element is a second variable capacitor, wherein a first end of the second variable capacitor is connected to the second inductor and the third inductor and a second end of the second variable capacitor is connected to ground, wherein a first capacitance of the first variable capacitor and a second capacitance of the second variable capacitor are adjusted to tune the frequency of the RF coil and match the impedance of the RF coil.

11. The method according to claim 10, wherein one or both of the first inductor and the second inductor are replaced with capacitors.

12. The method according to claim 10,
wherein the first capacitance of the first variable capacitor is adjusted to tune the frequency of the RF coil, wherein the second capacitance of the second variable capacitor is adjusted to match the impedance of the RF coil.

13. The method according to claim 1, wherein the box circuit comprises:
the first variable reactive element, wherein the first variable reactive element is a first variable capacitor; the second variable reactive element, wherein the second variable reactive element is a second variable capacitor; and a third variable capacitor connected in series between a first connector and a second connector;
a first inductor, wherein a first end of the first inductor is connected to the first variable capacitor and the second variable capacitor and a second end of the first inductor is connected to ground; and
a second inductor, wherein a first end of the second inductor is connected to the second variable capacitor and the third variable capacitor and a second end of the second inductor is connected to ground,
wherein a first capacitance of the first variable capacitor, a second capacitance of the second variable capacitor, and/or a third capacitance of the third variable capacitor are adjusted to tune the frequency of the RF coil and match the impedance of the RF coil.

14. The method according to claim 1, wherein the connecting cable has a length selected to provide a desired impedance value.

15. The method according to claim 1, further comprising:
providing a second box circuit connected to the RF coil at a second location on the length of the connecting cable.

16. The method according to claim 1, wherein at least a portion of the connecting cable is positioned within a fiberglass tube.

17. The method according to claim 1, wherein the connecting cable is a transmission line.

18. The method according to claim 1, wherein the connecting cable is a coaxial cable.

19. The method according to claim 1,
wherein the frequency of the RF coil is greater than 100 MHz.

20. The method according to claim 1,
wherein the frequency of the RF coil is greater than 150 MHz.

21. The method according to claim 1,
wherein the frequency of the RF coil is greater than 300 MHz.

22. An apparatus, comprising:
an RF coil;
a box circuit; and
a connecting cable connecting the RF coil to the box circuit,
wherein the box circuit allows tuning the frequency of the RF coil and matching of the impedance of the RF coil, wherein the box circuit allows tuning the frequency of the RF coil and matching the impedance of the RF coil by allowing:
adding and/or removing reactance; and/or
introducing and/or removing a phase shift,
wherein adding and/or removing reactance via the box circuit, and/or introducing and/or removing a phase shift via the box circuit, comprises adjusting a first reactance of a first variable reactive element and adjusting a second reactance of a second variable reactive element.

23. The apparatus according to claim 22, wherein the RF coil is an NMR RF coil.

24. The apparatus according to claim 22, wherein the RF coil is an MRI RF coil.

25. The apparatus according to claim 22,
wherein the box circuit is located at least 1 foot from the RF coil.

26. The apparatus according to claim 22,
wherein the box circuit is located at least 3 feet from the RF coil.

27. The apparatus according to claim 22,
wherein the box circuit is between 1 foot and 3 feet from the RF coil.

28. The apparatus according to claim 22,
wherein the box circuit is between 3 feet and 9 feet from the RF coil.

29. The apparatus according to claim 22, wherein the RF coil comprises:
a tuning capacitor.

30. The apparatus according to claim 29, wherein the RF coil further comprises:
an impedance matching capacitor and a load adjusting capacitor, wherein the
tuning capacitor, the impedance matching capacitor, and the load adjusting capacitor are fixed value capacitors.

31. The apparatus according to claim 22, wherein the box circuit comprises:
a first inductor, a second inductor, and a third inductor connected in series between a first connector and a second connector;
the first variable reactive element, wherein the first variable reactive element is a first variable capacitor, wherein a first end of the first variable capacitor is connected to the first inductor and the second inductor and a second end of the first variable capacitor is connected to ground; and
the second variable reactive element, wherein the second variable reactive element is a second variable capacitor, wherein a first end of the second variable capacitor is connected to the second inductor and the third inductor and a second end of the second variable capacitor is connected to ground,
wherein a first capacitance of the first variable capacitor and a second capacitance of the second variable capacitor are adjusted to tune the frequency of the RF coil and match the impedance of the RF coil.

32. The apparatus according to claim 31, wherein one or both of the first inductor and the second inductor are replaced with capacitors.

33. The apparatus according to claim 31,
wherein the first capacitance of the first variable capacitor is adjusted to tune the frequency of the RF coil, wherein the third capacitance of the third variable capacitor is adjusted to match the impedance of the RF coil.

34. The apparatus according to claim 22, wherein the box circuit comprises:
the first variable reactive element, wherein the first variable reactive element is a first variable capacitor; a second variable capacitor; and the second variable reactive element, wherein the second variable reactive element is a third variable capacitor connected in series between a first connector and a second connector;

a first inductor, wherein a first end of the first inductor is connected to the first variable capacitor and the second variable capacitor and a second end of the first inductor is connected to ground; and a second inductor, wherein a first end of the second inductor is connected to the second variable capacitor and the third variable capacitor and a second end of the second inductor is connected to ground, wherein a first capacitance of the first variable capacitor, a second capacitance of the second variable capacitor, and/or a third capacitance of the third variable capacitor are adjusted to tune the frequency of the RF coil and match the impedance of the RF coil.

35. The apparatus according to claim 22, wherein the connecting cable has a length selected to provide a desired impedance value.

36. The apparatus according to claim 22, further comprising:
providing a second box circuit connected to the RF coil at a second location on the length of the connecting cable.

37. The apparatus according to claim 22, wherein at least a portion of the connecting cable is positioned within a fiberglass tube.

38. The apparatus according to claim 22, wherein the connecting cable is a transmission line.

39. The apparatus according to claim 22, wherein the connecting cable is a coaxial cable.

40. The apparatus according to claim 22,
wherein the frequency of the RF coil is greater than 100 MHz.

41. The apparatus according to claim 22,
wherein the frequency of the RF coil is greater than 150 MHz.

42. The apparatus according to claim 22,
wherein the frequency of the RF coil is greater than 300 MHz.

43. An apparatus for tuning and matching an RF coil, comprising:
a box circuit; and
a connecting cable wherein the connecting cable is adapted to connect the box circuit to an RF coil,
wherein the box circuit, allows tuning the frequency of the RF coil and matching of the impedance of the RF coil,
wherein the box circuit allows tuning the frequency of the RF coil and matching the impedance of the RF coil by allowing:
adding and/or removing reactance; and/or
introducing and/or removing a phase shift,
wherein adding and/or removing reactance via the box circuit, and/or introducing and/or removing a phase shift via the box circuit, comprises adjusting a first reactance of a first variable reactive element and adjusting a second reactance of a second variable reactive element.

44. The apparatus according to claim 43, wherein the RF coil is an NMR RF coil.

45. The apparatus according to claim 43, wherein the RF coil is an MRI RF coil.

46. The apparatus according to claim 43,
wherein the box circuit is located at least 1 foot from the RF coil, 47. The apparatus according to claim 43,
wherein the box circuit is located at least 3 feet from the RF coil.

48. The apparatus according to claim 43,
wherein the box circuit is between 1 foot and 3 feet from the RF coil.

49. The apparatus according to claim 43,
wherein the box circuit is between 3 feet and 9 feet from the RF coil.

50. The apparatus according to claim 43, wherein the RF coil comprises:
a tuning capacitor.

51. The apparatus according to claim 50, wherein the RF coil further comprises:
an impedance matching capacitor and a load adjusting capacitor, wherein the
tuning capacitor, the impedance matching capacitor, and the load adjusting capacitor are fixed value capacitors.

52. The apparatus according to claim 43, wherein the box circuit comprises:
a first inductor, a second inductor, and a third inductor connected in series between a first connector and a second connector;
the first variable reactive element, wherein the first variable reactive element is a first variable capacitor, wherein a first end of the first variable capacitor is connected to the first inductor and the second inductor and a second end of the first variable capacitor is connected to ground; and
the second variable reactive element, wherein the second variable reactive element is a second variable capacitor, wherein a first end of the second variable capacitor is connected to the second inductor and the third inductor and a second end of the second variable capacitor is connected to ground,
wherein a first capacitance of the first variable capacitor and a second capacitance of the second variable capacitor are adjusted to tune the frequency of the RF coil and match the impedance of the RF coil.

53. The apparatus according to claim 52, wherein one or both of the first inductor and the second inductor are replaced with capacitors.

54. The apparatus according to claim 52,
wherein the first capacitance of the first variable capacitor is adjusted to tune the frequency of the RF coil, wherein the third capacitance of the third variable capacitor is adjusted to match the impedance of the RF coil.

55. The apparatus according to claim 43, wherein the box circuit comprises:
the first variable reactive element, wherein the first variable reactive element is a first variable capacitor; a second variable capacitor; and the second variable reactive element, wherein the second variable reactive element is a third variable capacitor connected in series between a first connector and a second connector;
a first inductor, wherein a first end of the first inductor is connected to the first variable capacitor and the second variable capacitor and a second end of the first inductor is connected to ground; and
a second inductor, wherein a first end of the second inductor is connected to the second variable capacitor and the third variable capacitor and a second end of the second inductor is connected to ground,
wherein a first capacitance of the first variable capacitor, a second capacitance of the second variable capacitor, and/or a third capacitance of the third variable capacitor are adjusted to tune the frequency of the RF coil and match the impedance of the RF coil.

56. The apparatus according to claim 43, wherein the connecting cable has a length selected to provide a desired impedance value.

57. The apparatus according to claim 43, further comprising:
   providing a second box circuit connected to the RF coil at a second location on the length of the connecting cable.

58. The apparatus according to claim 43, wherein at east a portion of the connecting cable is positioned within a fiberglass tube.

59. The apparatus according to claim 43, wherein the connecting cable is a transmission line.

60. The apparatus according to claim 43, wherein the connecting cable is a coaxial cable.

61. The apparatus according to claim 43, wherein the frequency of the RF coil is greater than 100 MHz.

62. The apparatus according to claim 43, wherein the frequency of the RF coil is greater than 150 MHz.

63. The apparatus according to claim 43, wherein the frequency of the RF coil is greater than 300 MHz.

* * * * *

UNITED STATES PATENT AND TRADEMARK OFFICE
CERTIFICATE OF CORRECTION

PATENT NO. : 8,207,735 B2  
APPLICATION NO. : 12/522731  
DATED : June 26, 2012  
INVENTOR(S) : Melvin Daniel Clark and John Robert Forder It is certified that error appears in the above-identified patent and that said Letters Patent is hereby corrected as shown below:

Column 2,  
Line 32, "for used in" should read --for use in--.

Column 3,  
Line 37, "transcieve" should read --transceive--.

Column 3,  
Line 42, "Quadrature" should read --quadrature--.

Column 6,  
Line 39, "particular" should read --particularly--.

Column 13,  
Line 5, "at east a" should read --at least a--.

Signed and Sealed this  
Twelfth Day of March, 2013

Teresa Stanek Rea  
*Acting Director of the United States Patent and Trademark Office*